United States Patent [19]
Kovacs et al.

[11] Patent Number: 5,793,239
[45] Date of Patent: Aug. 11, 1998

[54] COMPOSITE LOAD CIRCUIT

[75] Inventors: Janos Kovacs, North Andover; Kevin McCall, Leominster, both of Mass.

[73] Assignee: Analog Devices, Inc., Norwood, Mass.

[21] Appl. No.: 920,692

[22] Filed: Aug. 29, 1997

Related U.S. Application Data

[63] Continuation of Ser. No. 807,821, Feb. 26, 1997, abandoned, which is a continuation of Ser. No. 496,101, Jun. 29, 1995, abandoned.

[51] Int. Cl.$^6$ .................................................. H03H 11/26
[52] U.S. Cl. ........................... 327/262; 327/287; 327/543; 327/563; 327/65; 307/130
[58] Field of Search .......................... 327/52, 65, 266, 327/274, 280, 287, 427, 434, 560, 563, 543, 170, 375, 389, 391, 437, 262, 277, 278, 312, 313, 327, 334; 326/87, 91; 307/113, 115, 130, 140

[56] References Cited

U.S. PATENT DOCUMENTS

| | | | |
|---|---|---|---|
| 3,585,411 | 6/1971 | Cecchin | 327/119 |
| 4,477,735 | 10/1984 | Gollinger et al. | 326/87 |
| 4,490,669 | 12/1984 | Wilhelm | 327/530 |
| 4,553,043 | 11/1985 | Parker | 326/87 |
| 4,962,482 | 10/1990 | Jinbo | 327/52 |
| 5,061,861 | 10/1991 | Sameshima et al. | 327/108 |
| 5,270,586 | 12/1993 | Emori et al. | 327/278 |
| 5,283,479 | 2/1994 | Rosseel et al. | 327/535 |
| 5,324,994 | 6/1994 | Sullivan et al. | 327/58 |
| 5,359,301 | 10/1994 | Candage | 327/262 |
| 5,394,028 | 2/1995 | Feddeler et al. | 327/170 |
| 5,491,430 | 2/1996 | Makino et al. | 327/328 |
| 5,550,486 | 8/1996 | Sweeney et al. | 326/87 |

OTHER PUBLICATIONS

Weigandt, Todd C. et al., "Analysis of Timing Jitter in CMOS Ring Oscillators", 1994 IEEE International Symposium on Circuits and Systems (ISCAS) proceedings, pp. 27–30.

Primary Examiner—Toan Tran
Assistant Examiner—Terry L. Englund
Attorney, Agent, or Firm—Iandiorio & Teska

[57] ABSTRACT

A composite load circuit for use within another circuit includes at least one amplifying transistor. The composite load circuit includes first and second transistors connected in parallel. Each load transistor has a gate that receives a common control voltage. Each load transistor also has a different turn-on threshold voltage. A resistor, connected in parallel with the load transistors, limits an effective impedance of the load transistors.

14 Claims, 5 Drawing Sheets

COMPOSITE LOAD CIRCUIT

This is a continuation of application Ser. No. 08/807,821, filed Feb. 26, 1997, now abandoned which is a continuation of Ser. No. 08/496,101, filed Jun. 29, 1995, now abandoned.

FIELD OF THE INVENTION

The present invention relates generally to a transistor load circuit and, more particularly, to a load circuit that can operate with a wide current range within a current-controlled delay circuit.

BACKGROUND OF THE INVENTION

Voltage controlled oscillators (VCO) commonly are used in phase-locked-loops (PLL) for clock and data recovery, frequency synthesis, clock synchronization and many applications which require multi-phase sampling. A typical VCO as used in a PLL is shown in FIG. 1. As shown, the VCO 10 includes multiple delay elements 14, 16, 18 and 20 connected in cascade. The differential output of delay element 14 is provided as the differential input to delay element 16. Similarly, the differential output of delay element 16 is provided as the differential input to delay element 18 and the differential output of delay element 18 is provided as the differential input of delay element 20. The differential output of delay element 20 is fed back as the differential input of delay element 14. While the VCO 10 is shown in FIG. 1 as a differential circuit, it should be appreciated that single ended implementations also are used.

The VCO further includes a replica biasing circuit 12 that generates bias voltages to bias circuit elements in each of the delay elements 14, 16, 18 and 20. The bias voltages are provided from the replica biasing circuit to each of the delay elements along line 22. The circuit of each delay element commonly is implemented in CMOS technology due to its speed, accuracy and simplicity. Each delay element typically includes a current-controlled CMOS circuit in which a control current controls the delay through the element. The delay of each element, in turn, affects the phase frequency of the output signal from that element. It is desirable in many applications to achieve a wide range of frequencies (and clock phases) and, thus, to have each delay element operable with a wide range of a control current.

FIG. 2 is a schematic diagram showing a typical replica biasing circuit and FIG. 3 is a schematic diagram showing a typical delay element biased by the replica biasing circuit shown in FIG. 2. As shown, the replica biasing circuit includes a differential amplifier 24 arrangement including two NMOS transistors MNA and MNB, the sources of which are connected through a current source 26 to ground. The current source is a variable current source providing a control current $I_{CONTROL}$ that both controls the biasing voltage $V_{BIAS}$ output by the replica biasing circuit and controls the delay through each delay element, as will be explained with reference to FIG. 3.

The replica biasing circuit also includes an operational amplifier 28 having an inverting input 30, a non-inverting input 32 and an output line 34. The inverting input 30 receives a constant input voltage $V_{SWING}$ and the output line 34 of the operational amplifier 28 is operatively connected to the gate of MP1 which provides the biasing voltage $V_{BIAS}$ of the circuit that is, in turn, provided to each delay element in the oscillator, as will be explained with reference to FIG. 3. The input voltage $V_{SWING}$ also is provided along line 40 to bias the gate of transistor MNB. The non-inverting input 32 of operational amplifier 28 is provided to output node $N_{OUT}$ which also is connected to the drain of transistor MNA.

The replica biasing circuit also includes a load transistor MP1 that provides a resistive load to transistor MNA. As shown, the load transistor MP1 is a PMOS transistor, and the drain of transistor MP1 is connected through the output node $N_{OUT}$ to the drain of transistor MNA. The gate of transistor MP1 is connected to the output line 34 of operational amplifier 28 and provides the biasing voltage $V_{BIAS}$ of the circuit. A constant supply voltage $V_{SUPPLY}$ is provided along line 36 to the source of transistor MP1 and along line 38 to bias the gate of transistor MNA and to the drain of transistor MNB.

FIG. 3 shows one of the delay elements of a VCO which receives the biasing voltage $V_{BIAS}$ along output line 34 from the replica biasing circuit of FIG. 2. Like elements are referred to by same reference characters in the circuit of FIG. 3. As shown, the delay element includes a differential amplifier arrangement of NMOS transistors MNA and MNB, the sources of which are connected through the variable current source 26 to ground. The current source produces control current $I_{CONTROL}$ which controls the delay through the element. This circuit is shown as a differential circuit including differential inputs 42 and 44 respectively receiving input voltages $V+_{IN}$ and $V-_{IN}$ at the gates of transistors MNB and MNA. The circuit also includes differential outputs 46 and 48 respectively connected to the drains of transistors MNA and MNB that provide differential output voltages $V+_{OUT}$ and $V-_{OUT}$.

Each of the NMOS transistors of the differential amplifier 24 is connected to a PMOS load transistor. Amplifying transistor MNB is connected to load transistor MP1B and amplifying transistor MNA is connected to load transistor MP1A. The drain of transistor MP1B is connected to the drain of transistor MNB and the drain of transistor MP1A is connected to the drain of transistor MNA. As shown, the gate of each of transistors MP1B and MP1A is biased by the biasing voltage $V_{BIAS}$ received from the replica biasing circuit along output line 34. The source of each of transistors MP1B and MP1A receives the supply voltage $V_{SUPPLY}$ from supply line 36.

By varying the control current $I_{CONTROL}$ of the variable current source 26, the delay through each delay element is controlled. It is desirable to have a delay element circuit and replica biasing circuit which are operable with a wide range of control currents $I_{CONTROL}$. In certain applications, a capacitor (not shown) is connected to each output of the delay element. The charging time (time constant) for each capacitor is related to the output voltage and the output current. Thus, a wider range of current values enables a wider range of charging times which, in turn, enables a wider range of frequencies of the VCO.

The PMOS transistors MP1B and MP1A are used as load transistors for each of the amplifying transistors MNA and MNB. The load transistors MP1B and MP1A are operated in the triode or linear region so that their impedance is low. The drain resistance of each PMOS transistor is the load resistance to a respective amplifying transistor. The drain resistance of each load affects the charging time or the delay of each delay element. It is desirable for that resistance to be low and varying for a constant input voltage $V_{SWING}$ and a varying control current $I_{CONTROL}$. Otherwise, inaccurate biasing voltages will be produced by the replica biasing circuit and delays unrelated to the control current $I_{CONTROL}$ will be produced by each delay element in the VCO.

With the prior art circuits of FIGS. 2 and 3, a relatively narrow range of control currents $I_{CONTROL}$ is available due to the limited operable range in the triode region of the load transistors. When a control current $I_{CONTROL}$ is too low, the gate-to-source voltage $V_{GS}$ of transistor MP1B is reduced as the current flowing through the transistor MP1B is reduced, and transistor MP1B tends to leave the triode region and to enter the saturation region. When transistor MP1B is in saturation, the drain resistance of the transistor increases considerably. Thus, the resistance at the output node of each delay element is increased which, in turn, affects the delay through each delay element rendering it less related to the control current $I_{CONTROL}$ and, therefore, less controllable.

When the control current $I_{CONTROL}$ is too high, the gate-to-source voltage $V_{GS}$ of the load transistor MP1B is limited in magnitude to the supply voltage and the PMOS device again is saturated.

It is desirable to increase the range of control currents with which such prior art current-controlled CMOS circuits can accurately operate.

SUMMARY OF THE INVENTION

The present invention is directed to a composite load circuit for use in a circuit including at least one amplifying transistor. The composite load circuit of the invention includes a resistor that is coupled to the amplifying transistor and at least a first load transistor connected in parallel with the resistor. The resistor limits the effective impedance of the load transistor.

In a preferred embodiment of the invention, the load circuit further includes a second load transistor connected in parallel with the resistor and the first load transistor. The second load transistor limits the current flow through the first transistor.

In one embodiment of the invention, the amplifying transistor is an NMOS transistor and the load transistors are PMOS transistors.

Preferably, the first and second load transistors have different widths.

In one embodiment of the invention, the first and second load transistors have different threshold turn-on voltages. In another embodiment of the invention, the load circuit further includes a constant offset voltage connected between a gate terminal of each of the first and second load transistors such that they turn on at different times.

Another embodiment of the invention is directed to a composite load circuit for use in a circuit including at least one amplifying transistor. The composite load circuit includes at least first and second load transistors connected in parallel with one another and coupled to the amplifying transistor.

Objects and advantages of the invention should become apparent from a reading of the following detailed description with reference to the figures.

DETAILED DESCRIPTION

By contrast with prior art replica biasing circuits and prior art delay circuits, each of the replica biasing circuit and delay circuits of the present invention has a composite load circuit that includes at least two PMOS transistors connected in parallel with a resistor. The two load transistors have different threshold voltages or include a circuit element causing them to turn on at different times.

Figure 4:
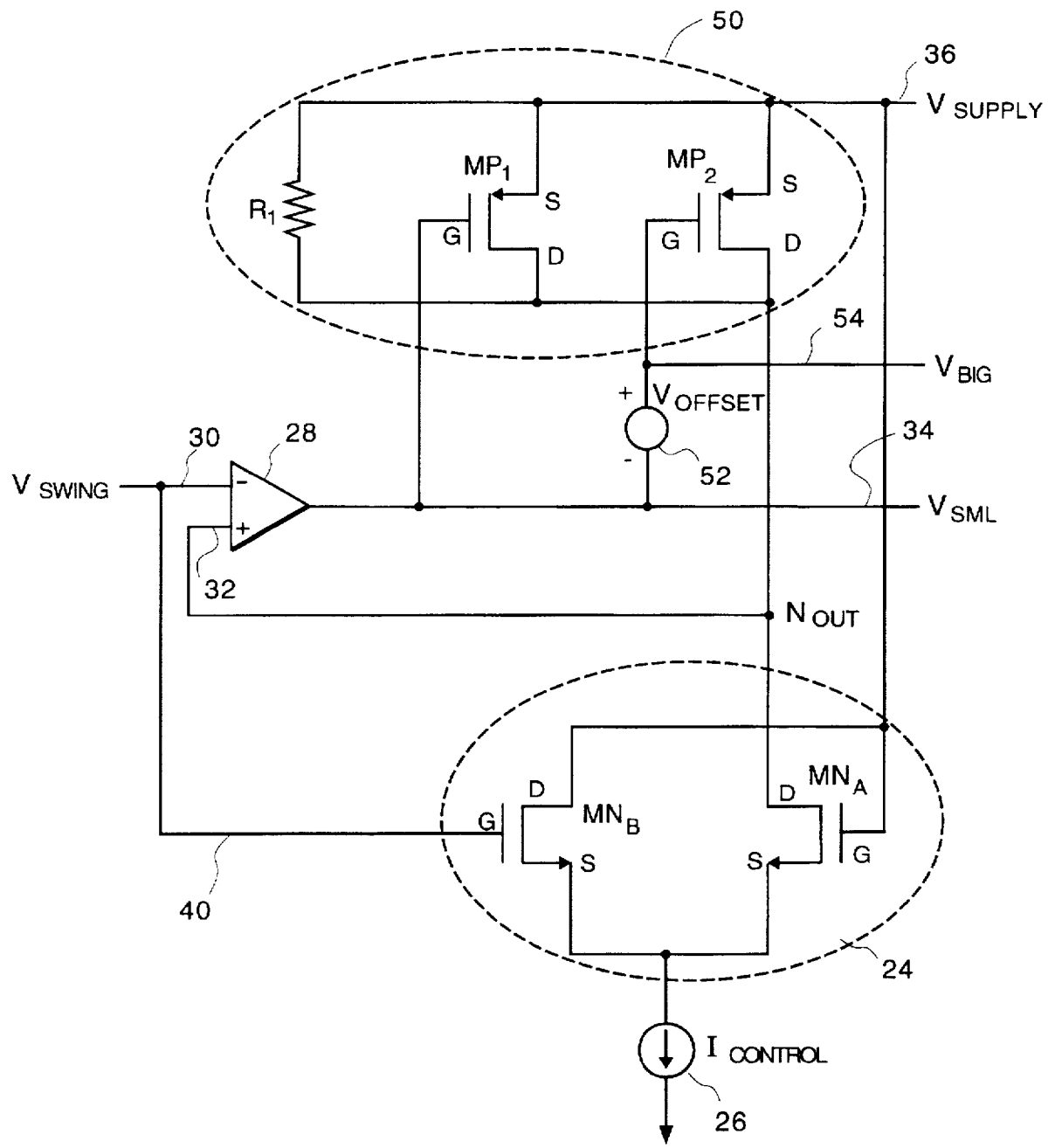
FIG. 4 is a schematic diagram of a replica biasing circuit according to the present invention.

FIG. 4 is a schematic diagram of the replica biasing circuit according to the present invention where like elements are referred to by identical reference characters. As shown, the replica biasing circuit includes the differential amplifier arrangement 24 including NMOS transistors MNA and MNB. Also shown is the variable current source 26 providing control current $I_{CONTROL}$ from the sources of NMOS transistors MNA and MNB. Also included is an operational amplifier 28 including an inverting input 30 and a non-inverting input 32, as well as an output line 34. The inverting input 30 receives a constant input voltage $V_{SWING}$ which also is provided along line 40 to bias the gate of amplifying transistor MNB. The non-inverting input 32 is provided to output node $N_{OUT}$ and to the drain of amplifying transistor MNA. The gate of amplifying transistor MNA is biased by the supply voltage $V_{SUPPLY}$. The output line 34 of operational amplifier 28 is coupled to the gate of a load transistor MP1 which provides the biasing voltage $V_{SML}$.

By contrast with the prior art replica biasing circuit, the replica biasing circuit of the present invention includes a composite load circuit 50. The composite load circuit 50 includes two PMOS transistors MP1 and MP2 connected in parallel as well as a resistor R1 connected in parallel with both transistors MP1 and MP2. The gate of transistor MP1 is connected to the output line 34 of operational amplifier 28 and transistor MP1 is therefore biased by the biasing voltage $V_{SML}$. The gate of transistor MP2 is connected to line 54 which provides biasing voltage $V_{BIG}$. Therefore, transistor MP2 is biased by biasing voltage $V_{BIG}$.

Connected between line 54 and line 34 is a constant offset voltage 52 $V_{OFFSET}$. Thus a constant offset voltage $V_{OFFSET}$ exists between the gate of transistor MP1 and the gate of transistor MP2. Preferably, in this arrangement, the transistors include an identical threshold voltage and, because of the offset voltage, the transistors are caused to turn on at different times. Alternatively, as will be understood by those skilled in the art, the transistors MP1 and MP2 can have different threshold voltages in which case the offset voltage $V_{OFFSET}$ 52 is unnecessary.

The sources of transistors MP1 and MP2 are connected to the supply line 36 and receive the supply voltage $V_{SUPPLY}$. The drains of transistors MP1 and MP2 are connected through the output node $N_{OUT}$ to the drain of transistor MNA. Similarly, resistor R1 is connected between supply line 36 and the drain of transistor MNA.

Figure 5:
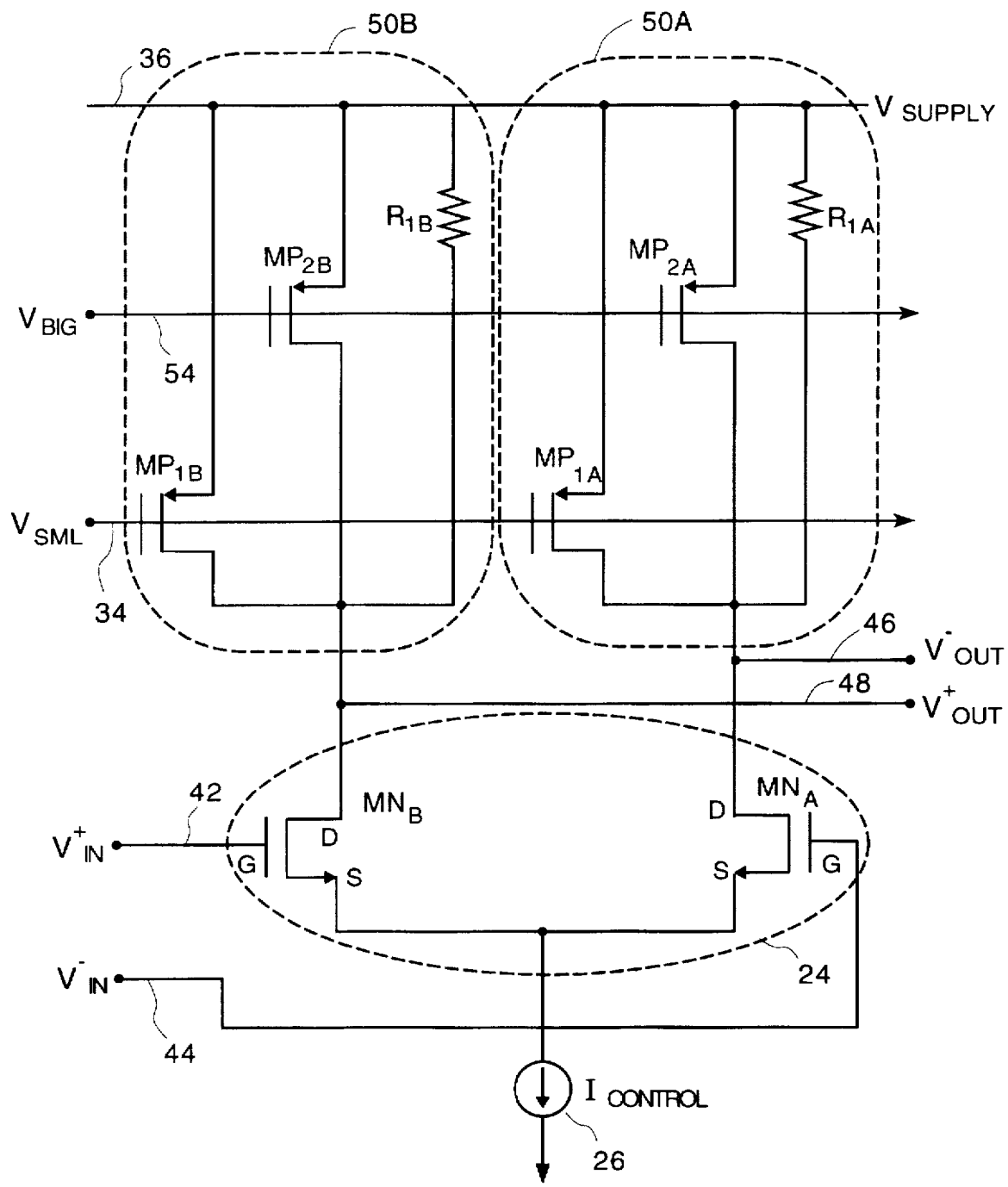
FIG. 5 is a schematic diagram of a delay circuit according to the present invention.

FIG. 5 is a schematic diagram of a delay element that is used with, and receives the biasing voltages from, the replica biasing circuit of FIG. 4. The delay element circuit of FIG. 5 is identical to that of FIG. 3 except for the composite load circuits 50A and 50B used to provide a resistive load to the drains of amplifying transistors MNA and MNB respectively. Each of the composite load circuits 50A and 50B is identical to the composite load circuit 50 used with the replica biasing circuit of FIG. 4. Each composite load circuit 50A and 50B includes two PMOS transistors MP1 and MP2 connected in parallel with a resistor R1. A composite load circuit 50A includes transistors MP1A and MP2A and resistor R1A connected in parallel between the supply line 36 and the drain of amplifying transistor MNA. Similarly, composite load circuit 50B includes transistors MP1B and MP2B and resistor R1B connected in parallel between supply voltage line 36 and the drain of amplifying transistor MNB.

The gates of transistors MP1A and MP1B are connected to output line 34 and transistors MP1A and MP1B therefore are biased by biasing voltage $V_{SML}$ received from the replica biasing circuit of FIG. 4. The gates of transistors MP2A and MP2B are connected to line 54 and are therefore biased by the biasing voltage $V_{BIG}$ received from the replica biasing circuit of FIG. 4. Each of the delay elements in a delay line or VCO would be identical to the circuit shown in FIG. 5 and in which the differential output of one element would be received as the differential input of the subsequent element.

The use of the composite load circuit 50 shown and described enables a wider range of the control current $I_{CONTROL}$ which, in turn, enables a greater range of the delay through each delay element. During operation, when the control current $I_{CONTROL}$ is low (below a certain threshold such as the power operating range of the prior art circuits of FIGS. 2 and 3), in each of the composite load circuits 50, resistor R1 shunts the transistor MP1 and the majority of the current flows through the resistor R1 with the transistor MP1 operating in a border region between the triode region and the saturation region. Thus, the impedance value of the resistor R1, which is less than that of transistor MP1 operating at the border region, dominates as the effective load resistance. Additionally, because transistor MP1 is then operating in the border between the triode region and the saturation region, the effective resistance offered by the composite load circuit still can be varied by varying the control current. It should be appreciated from the foregoing that the resistance value of R1 is selected so that transistor MP1 is shunted when it is operating in the border region between the triode and saturation region.

Figure 1:
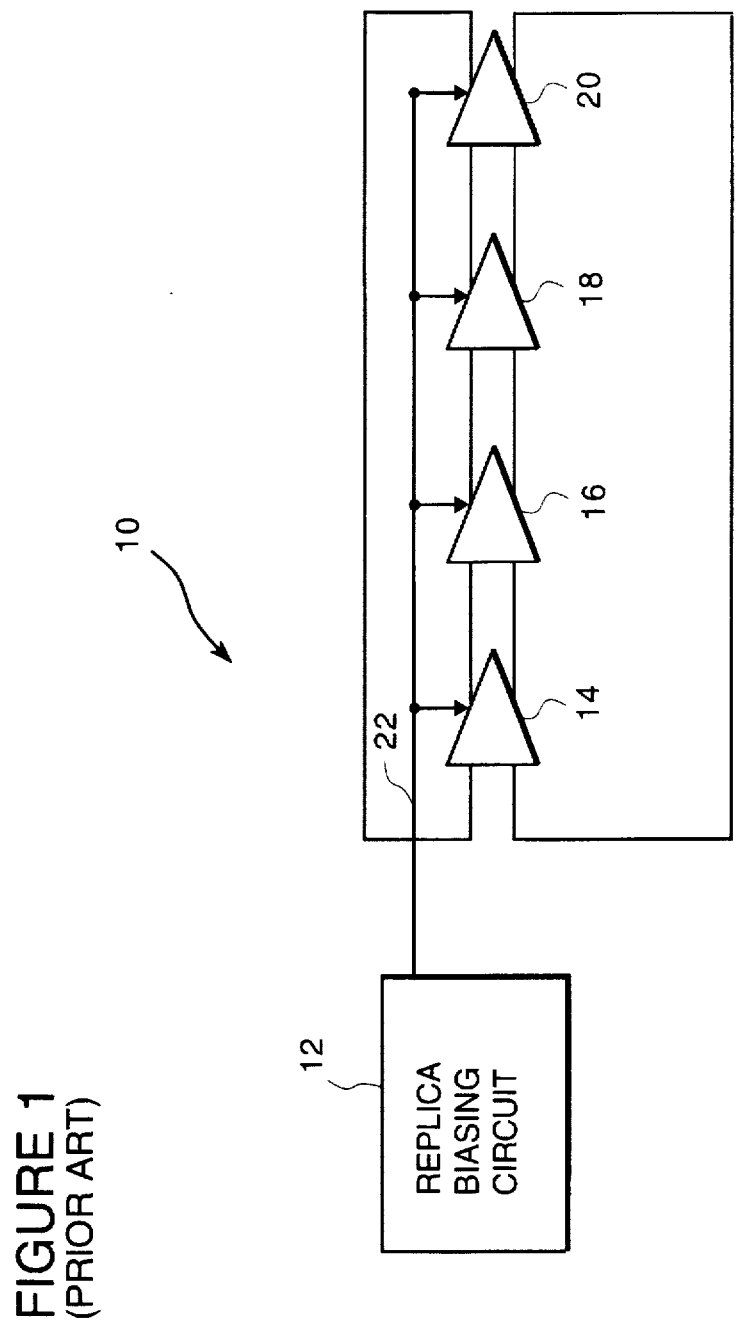
FIG. 1 is a block diagram of a prior art oscillator circuit.
Figure 2:
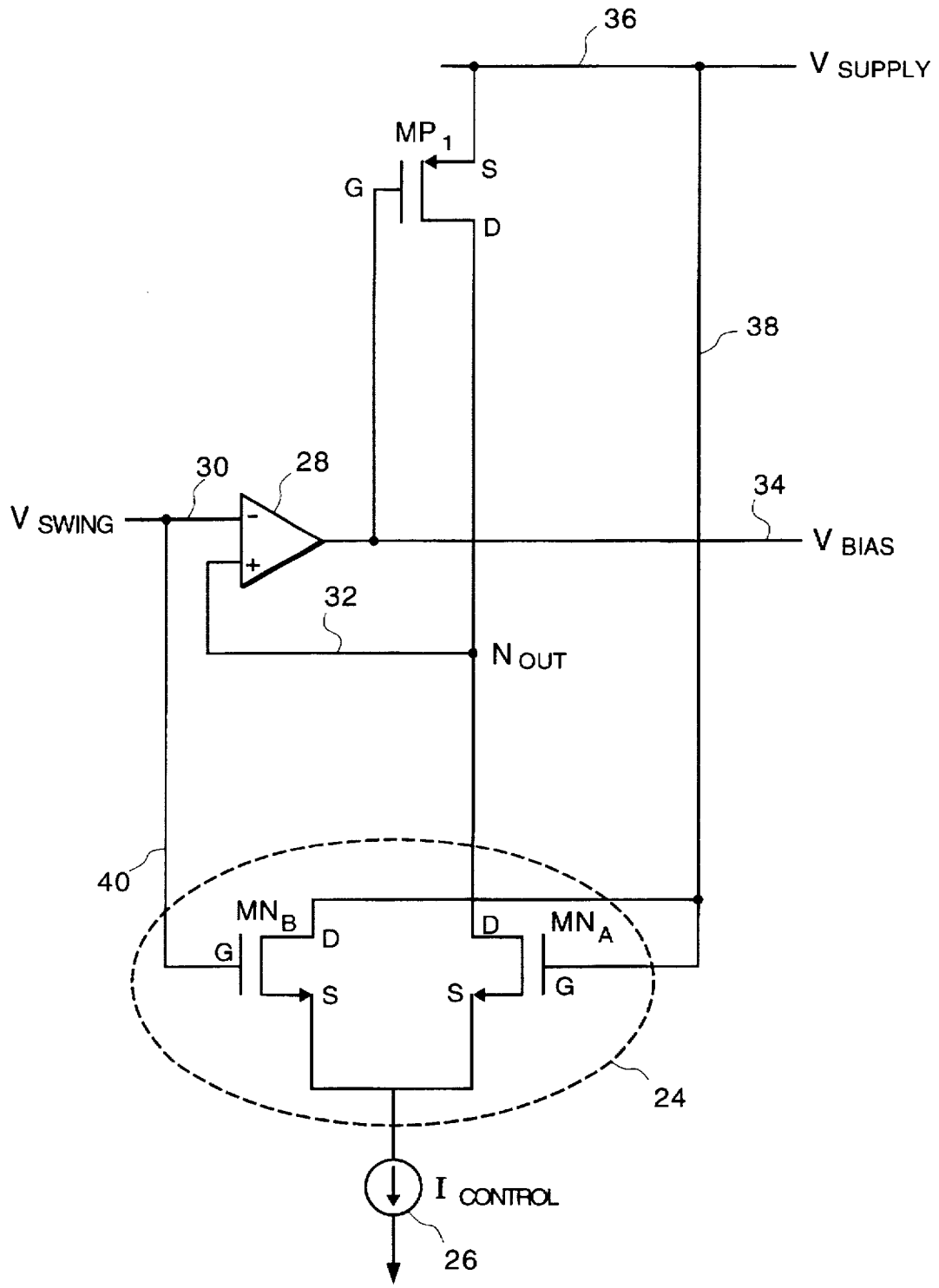
FIG. 2 is a schematic diagram of a prior art replica biasing circuit.
Figure 3:
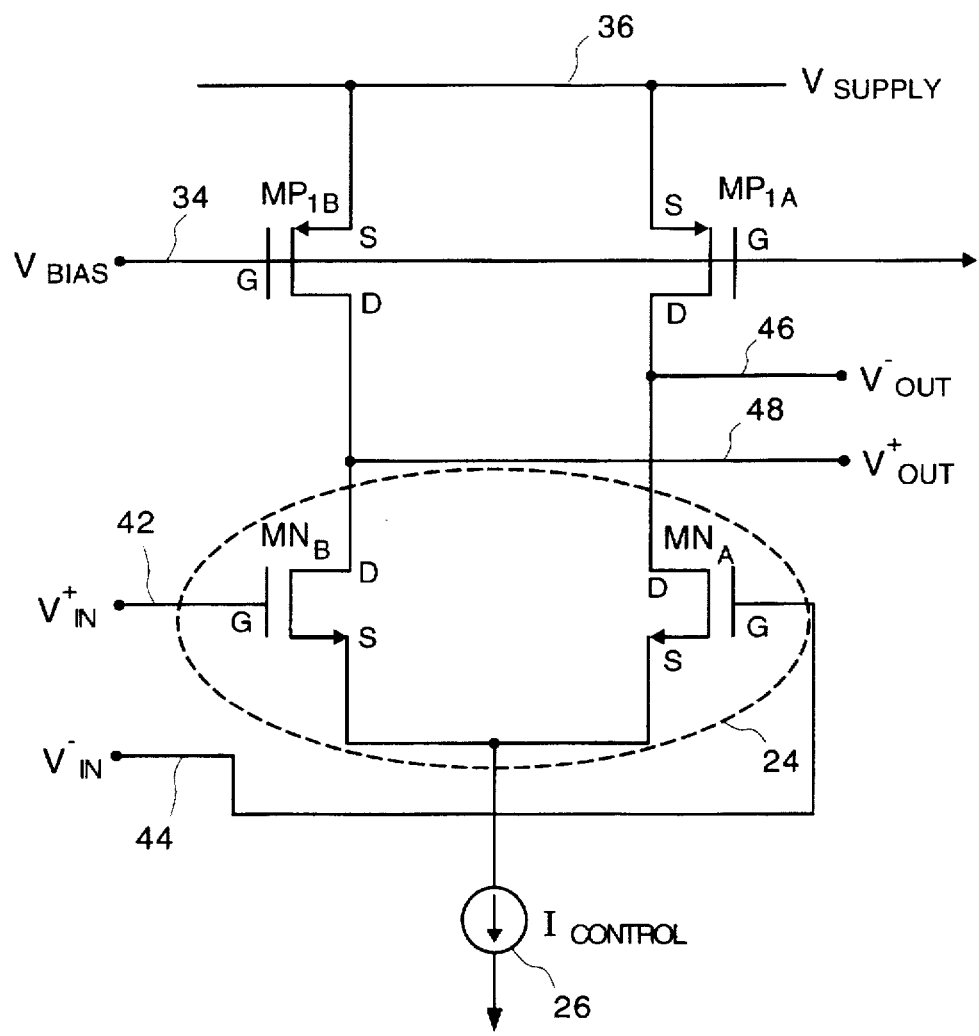
FIG. 3 is a schematic diagram of a prior art delay circuit.

Conversely, when the control current $I_{CONTROL}$ is high (above a certain threshold such as the upper operating range of the prior art circuits of FIGS. 2 and 3), the gate-to-source voltage $V_{GS}$ of transistor MP1 is also high and therefore the biasing voltage $V_{SML}$ is low. $V_{SML}$ is lowered, the $V_{GS}$ of MP2 rises, and MP2 begins to turn on with higher control current. $V_{OFFSET}$ causes MP2 to turn on at higher control currents than for MP1. Alternatively, as mentioned, transistors MP1 and MP2 can have different turn-on voltages, and $V_{OFFSET}$ would not be needed. When transistor MP2 turns on, because transistor MP2 has a width greater than that of transistor MP1 (preferably 10 times greater), most of the current flows through transistor MP2 limiting the current flowing through transistor MP1. This activity, in turn, limits the gate-to-source voltage $V_{GS}$ of transistor MP1 from further increasing which, in turn, limits the biasing voltage $V_{SML}$ from further decreasing preferably not lower than the minimum output voltage swing of the operational amplifier, ensuring proper operation of the operational amplifier 28 of the replica biasing circuit.

Thus, as shown and described, the parallel connection of resistor R1 and transistor MP1 increases the lower current range of control current $I_{CONTROL}$ by controlling the effective resistance of the load circuit. Also, the parallel connection of transistor MP2 and transistor MP1 increases the high current range of control current $I_{CONTROL}$ by ensuring proper operation of the operational amplifier of the replica biasing circuit. It should be understood by those skilled in the art that the parallel connection of the resistor R1 and transistor MP1 may be used alone as the composite load circuit or, alternatively, the parallel connection of the transistor MP2 and transistor MP1 may be used alone as the composite load circuit which would respectively increase the low control current and the high control current ranges.

It also should be understood, that although the composite load circuit was shown and described for use with a differential amplifier in a replica biasing circuit and delay elements of a VCO, it alternatively could be used within a write pre-compensation circuit and delay elements of a variable delay line. Also, and alternatively, the composite load circuit could be used with a single ended amplifying transistor.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

We claim:

1. A dynamic composite load for an amplifier circuit comprising:

at least first and second load transistors connected in parallel; and a resistor, connected in parallel with said first and second load transistors, for shunting said first and second load transistors when, in response to a control current, said first load transistor is off or operating in the border region and said second load transistor is off;

said first load transistor shunting said resistor and said second load transistor when said first load transistor, in response to said control current, is operating in the triode region;

said second load transistor turning on, in response to said control current, after said first load transistor has entered said triode region, said second load transistor shunting said resistor and said first load transistor as said control current increases.

2. The composite load of claim 1 in which the impedance of said resistor is less than the impedance of said first load transistor operating outside the triode region.

3. The composite load of claim 2 in which said first load transistor and said second load transistor have a common gate voltage.

4. The composite load of claim 3 in which said first load transistor and said second load transistor have different threshold voltages.

5. The composite load of claim 2 in which said first load transistor has a first gate voltage and said second load transistor has a second gate voltage, said first gate voltage differing from said second gate voltage by a constant offset voltage.

6. The composite load of claim 1 in which said second load transistor is substantially wider than said first load transistor.

7. The composite load of claim 1 in which said second load transistor is ten times wider than said first load transistor.

8. A current controlled delay circuit comprising:

an amplifier;

a current source for supplying a control current to said amplifier; and at least one composite load responsive to said control current, for loading said amplifier, each said composite load including at least first and second load transistors connected in parallel and a resistor, connected in parallel with said first and second load transistors, for shunting said first and second load transistors when, in response to said control current, said first load transistor is off or operating in the border region and said second load transistor is off;

said first load transistor shunting said resistor and said second load transistor when said first load transistor, in response to said control current, is operating in the triode region;

said second load transistor turning on, in response to said control current, after said first load transistor has entered its triode region, said second load transistor shunting said resistor and said first load transistor as said control current increases.

9. The current controlled delay circuit of claim 8 in which the impedance of said resistor is less than the impedance of said first load transistor operating outside the triode region.

10. The current controlled delay circuit of claim 9 in which said first load transistor and said second load transistor have a common gate voltage.

11. The current controlled delay circuit of claim 10 in which said first load transistor and said second load transistor have different threshold voltages.

12. The current controlled delay circuit of claim 9 in which said first load transistor has a first gate voltage and said second load transistor has a second gate voltage, said first gate voltage differing from said second gate voltage by a constant offset voltage.

13. The current controlled delay circuit of claim 8 in which said second load transistor is substantially wider than said first load transistor.

14. The current controlled delay circuit of claim 8 in which said second load transistor is ten times wider than said first load transistor.

* * * * *